(12) United States Patent
Obata et al.

(10) Patent No.: US 8,645,802 B2
(45) Date of Patent: Feb. 4, 2014

(54) ERROR CORRECTION DECODER AND STORAGE APPARATUS

(75) Inventors: Haruka Obata, Tokyo (JP); Hironori Uchikawa, Fujisawa (JP)

(73) Assignee: Kabushiki Kaisha Toshiba, Minato-ku, Tokyo (JP)

(*) Notice: Subject to any disclaimer, the term of this patent is extended or adjusted under 35 U.S.C. 154(b) by 183 days.

(21) Appl. No.: 13/225,759

(22) Filed: Sep. 6, 2011

(65) Prior Publication Data

US 2012/0226954 A1 Sep. 6, 2012

(30) Foreign Application Priority Data

Dec. 13, 2010 (JP) ................................. 2010-276646

(51) Int. Cl.
 *H03M 13/00* (2006.01)
(52) U.S. Cl.
 USPC ............................ 714/774; 714/752; 714/758
(58) Field of Classification Search
 USPC .................... 714/774, 752, 758, 763, 781
 See application file for complete search history.

(56) References Cited

U.S. PATENT DOCUMENTS

| 7,502,987 B2* | 3/2009 | Kyung et al. | 714/781 |
| 2008/0288846 A1* | 11/2008 | Kyung et al. | 714/752 |

OTHER PUBLICATIONS

Kang, et al., "A Two-Stage Iterative Decoding of LDPC Codes for Lowering Error Floors"; 2008, IEEE Globecom proceedings, pp. 1-4.

\* cited by examiner

*Primary Examiner* — Fritz Alphonse
(74) *Attorney, Agent, or Firm* — Ohlandt, Greeley, Ruggiero & Perle, L.L.P.

(57) ABSTRACT

According to embodiments, an error correction decoder carrying out iterative decoding for coded data based on LDPC code. The decoder comprises a generation unit and an inversion, control unit. The generation unit is configured to generate an inversion node list listing variable nodes connected to check nodes not satisfying a parity check when a code word cannot be obtained after carrying out the iterative decoding a first number of iterations. The inversion control unit is configured to choose a variable node which is a target for inversion from among the variable nodes listed in the inversion node list, and to carry out inversion processing which includes updating an input likelihood of the variable node which is the target for inversion temporarily by inverting a sign of an a posteriori likelihood of the variable node which is the target for inversion.

7 Claims, 8 Drawing Sheets

FIG. 3

|  | C1 | C2 | C3 | C4 | C5 | C6 | C7 | C8 | C9 | C10 | C11 | C12 |
|  | V1 | V2 | V3 | V4 | V5 | V6 | V7 | V8 | V9 | V10 | V11 | V12 |
|---|---|---|---|---|---|---|---|---|---|---|---|---|
| P1 | 1 | 1 | 0 | 1 | 0 | 0 | 0 | 0 | 0 | 0 | 0 | 0 |
| P2 | 0 | 0 | 1 | 0 | 1 | 0 | 0 | 0 | 1 | 0 | 0 | 0 |
| P3 | 1 | 0 | 0 | 0 | 0 | 0 | 0 | 0 | 1 | 0 | 0 | 1 |
| P4 | 0 | 0 | 0 | 1 | 0 | 0 | 1 | 0 | 0 | 1 | 0 | 0 |
| P5 | 0 | 0 | 0 | 0 | 1 | 0 | 0 | 1 | 0 | 0 | 1 | 0 |
| P6 | 0 | 0 | 0 | 0 | 0 | 1 | 1 | 0 | 0 | 1 | 0 | 0 |
| P7 | 0 | 0 | 1 | 0 | 0 | 1 | 0 | 1 | 0 | 0 | 0 | 0 |
| P8 | 0 | 1 | 0 | 0 | 0 | 0 | 0 | 0 | 0 | 0 | 1 | 1 |

A(2) = {3, 5, 9}

B(3) = {2, 7}

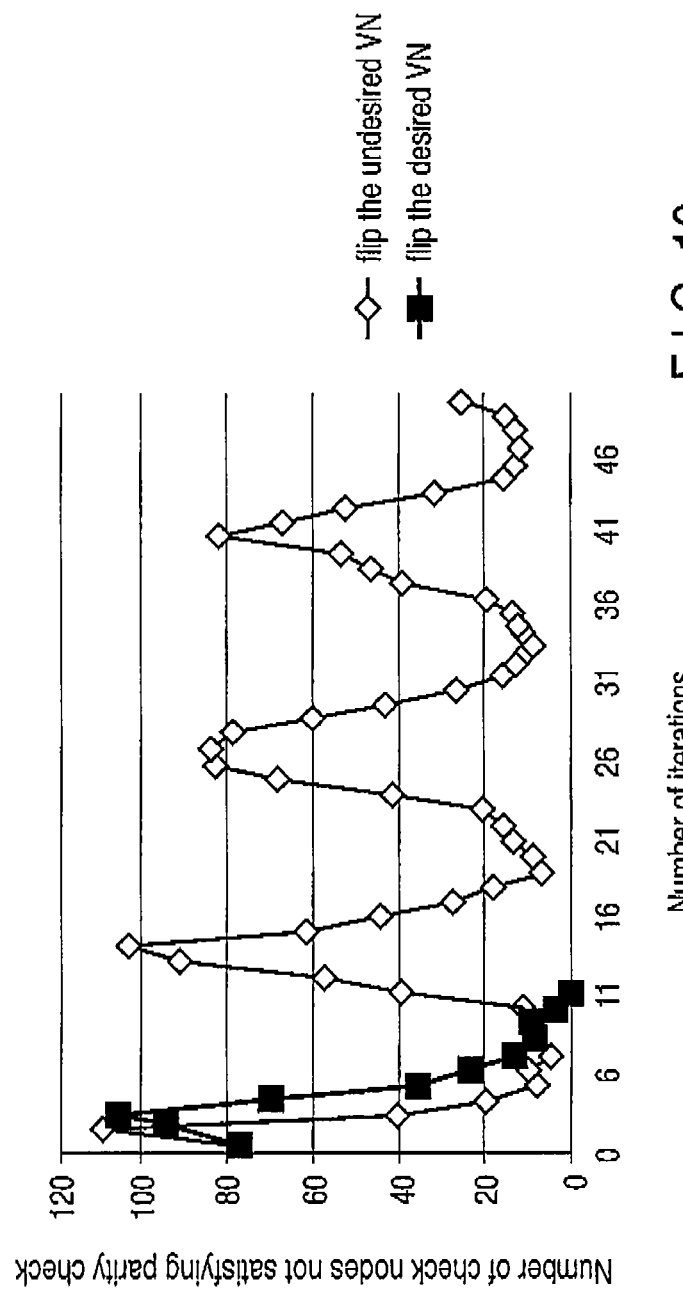
F I G. 10

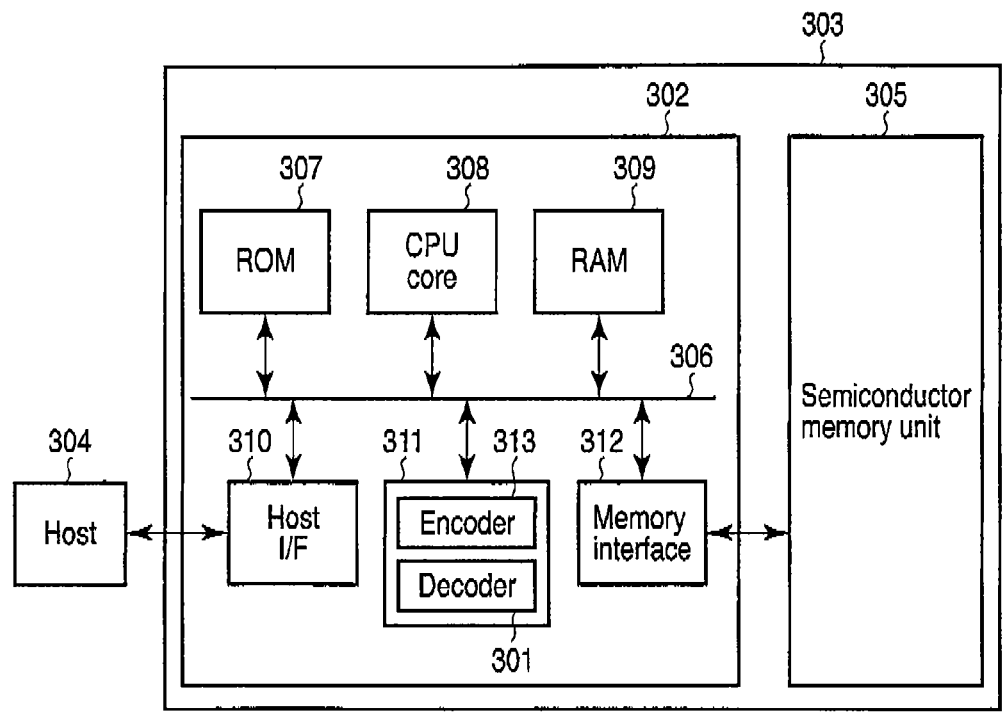
F I G. 11
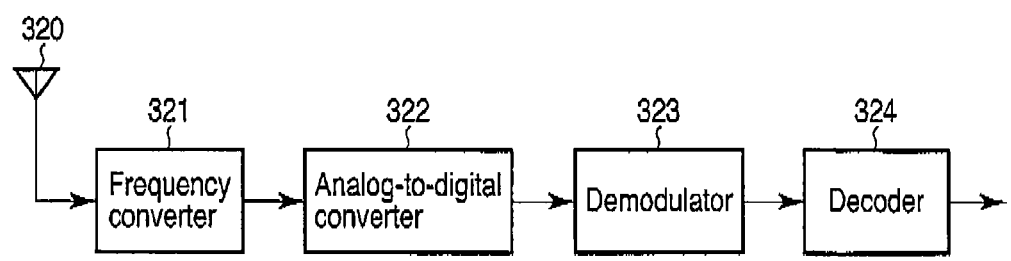
F I G. 12

ERROR CORRECTION DECODER AND STORAGE APPARATUS

CROSS-REFERENCE TO RELATED APPLICATIONS

This application is based upon and claims the benefit of priority from prior Japanese Patent Application No. 2010-276646, filed Dec. 13, 2010, the entire contents of which are incorporated herein by reference.

FIELD

Embodiments described herein relate generally to error correction using a low-density parity check (LDPC) code.

BACKGROUND

When transmitting or storing data, an error correction code is added to the data. The data to which the error correction code is added is decoded by an error correction decoder incorporated in a receiver or a memory controller.

If a few bit errors are included in received data or read data, the data can be accurately reconstituted by correcting the bit errors using the error correction code.

As an error correction code, an LDPC code is known. LDPC codes excel at correcting errors. Regarding LDPC codes, a phenomenon called "error floor" is known. When error floor is observed, a decoding error rate almost does not reduce in a region in which a bit error rate before decoding is below a certain level. Error floor is caused by an error event called "trapping set" during the process of iterative decoding using LDPC codes. When trapping set occurs, the iterative decoding does not function properly. By reducing a decoding error rate in the error floor region, the LDPC codes can exhibit better performance of error correction.

BRIEF DESCRIPTION OF THE DRAWINGS

FIG. 3 is an explanatory drawing of a parity check matrix.

FIG. 10 is an explanatory diagram of iteration discontinuation conditions.

FIG. 11 is a block diagram showing an example of a storage apparatus according to the second embodiment.

FIG. 12 is a block diagram showing an example of a receiver according to the third embodiment.

DETAILED DESCRIPTION

In the following, each embodiment will be explained with reference to the figures.

According to embodiments, an error correction decoder carrying out iterative decoding for coded data based on LDPC code. The decoder comprises a generation unit, an inversion control unit, a row processing unit, a parity check unit, an amplification control unit and a column processing unit. The generation unit is configured to generate an inversion node list listing variable nodes connected to check nodes not satisfying a parity check when a code word cannot be obtained after carrying out the iterative decoding a first number of iterations. The inversion control unit is configured to choose a variable node which is a target for inversion from among the variable nodes listed in the inversion node list, and to carry out inversion processing which includes updating an input likelihood of the variable node which is the target for inversion temporarily by inverting a sign of an a posteriori likelihood of the variable node which is the target for inversion. The row processing unit is configured to generate each extrinsic value based on each input likelihood and each a priori likelihood iteratively after carrying out the inversion processing. The parity check unit is configured to generate a temporary estimated word based on the each input likelihood and the each extrinsic value, to carry out the parity check for the temporary estimated word, and to determine the temporary estimated word as the code word when all check nodes satisfy the parity check. The amplification control unit is configured to carry out amplification processing to amplify an absolute value of the extrinsic value from a check node not satisfying the parity check to a variable node when at least one check node does not satisfy the parity check for the temporary estimated word. The column processing unit is configured to update the each a priori likelihood based on the each extrinsic value after the amplification processing.

(First Embodiment)

Figure 1:
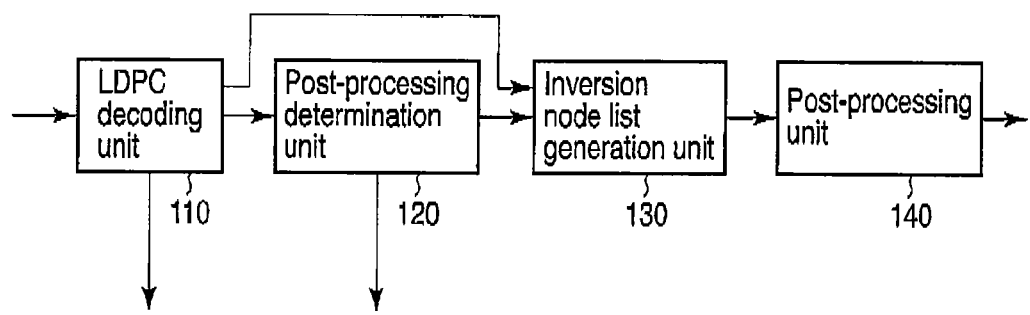
FIG. 1 is a block diagram showing an example of an error correction decoder according to the first embodiment.

An error correction decoder according to the first embodiment comprises, as shown in FIG. 1, an LDPC decoding unit, a post-processing determination unit 120, an inversion node list generation unit 130, and a post-processing unit 140.

The LDPC decoding unit 110 inputs input likelihood Fn of coded data (for example, a data frame) obtained from a signal processing unit (not shown) in a previous stage. The LDPC decoding unit performs iterative decoding of coded data based on so-called message passing algorithm (for example, Sum-Product algorithm, Min-Sum algorithm decoding method).

The LDPC decoding unit 110 outputs a result of the decoding (i.e., a code word) to the outside of the decoder (for example, a signal processing unit at a subsequent stage) if decoding of coded data at the process of iterative decoding succeeds (in other words, when all check nodes satisfy a parity check), and the decoding is completed. On the other hand, the LDPC decoding unit 110 provides the post-processing determination unit 120 with information indicating the number of check nodes not satisfying the parity check if the decoding fails (specifically, when a code word cannot be obtained even after iterating decoding a maximum number of times). Also, when the LDPC decoding unit 110 fails decoding (or the post-processing determination unit 120 determines that a post-processing should be carried out), the LDPC decoding unit 110 provides the inversion node list generation unit 130 with information to identify check nodes not satisfying the parity check (for example, index), information of LDPC parity check matrix (hereinafter, "LDPC parity check matrix" will be simply referred to as "parity check matrix"), and information indicating signs of an a posteriori likelihood of each variable node.

Figure 2:
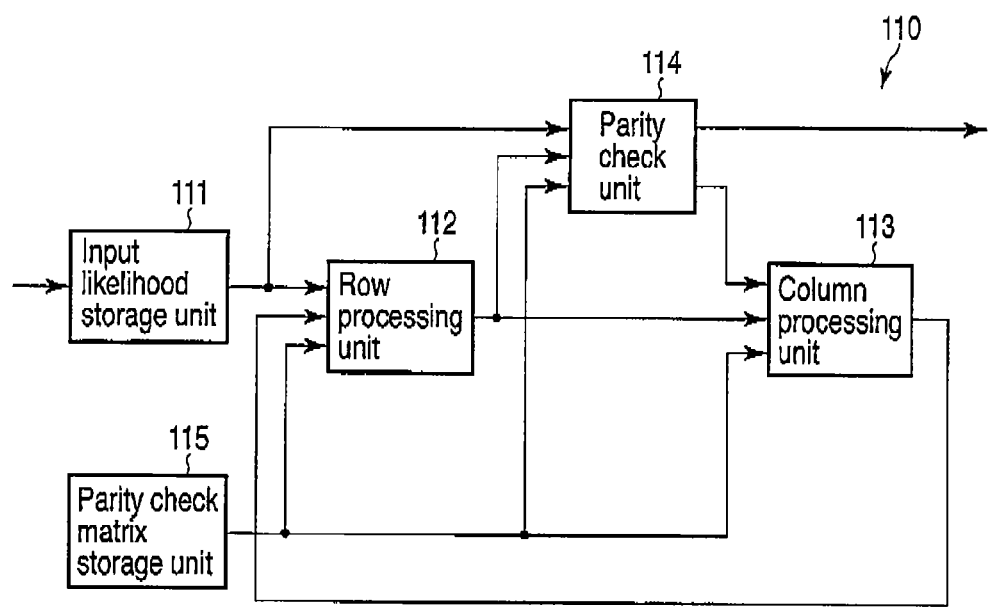
FIG. 2 is a block diagram showing an example of an LDPC decoding unit shown in FIG. 1.

As illustrated in FIG. 2, the LDPC decoding unit 120 comprises an input likelihood storage unit 111, a row processing unit 112, a column processing unit 113, a parity check unit 114, and a parity check matrix storage unit 115.

The input likelihood storage unit 111 inputs input likelihood Fn of coded data obtained by the signal processing unit at a previous stage. The input likelihood storage unit 111 retains input likelihood Fn until iterative decoding of the coded data at the LDPC decoding unit 110 is completed. The coded data is LDPC-coded, and the LDPC code is defined by a parity check matrix stored in the parity check matrix storage unit 115. Here, it is assumed that the LDPC code is so-called systematic code, and it consists of data bits and parity bits.

As an example, assuming coded data consisting of four data bits C1, . . . , C4 and eight parity bits C5, . . . , C12, the input likelihood storage unit 111 stores input likelihoods F1, . . . , F12 respectively corresponding to bits C1, . . . , C12. These input likelihoods F1, . . . , F12 are read by the row processing unit 112 and the parity check unit 114, as needed.

Herein, as expressed in the expression (1) below, a likelihood is a logarithmical value (a natural logarithm) of a ratio of a probability P (x=0) when a data bit is "0" to a probability P (x=1) when a data bit is "1". In the description hereinafter, an a priori likelihood means likelihood of an a priori probability, and an a posteriori likelihood means a likelihood of an a posteriori probability.

$$\ln \frac{P(x=0)}{P(x=1)} \quad (1)$$

The parity check matrix storage unit 115 stores information of a parity check matrix H with M rows and N columns in advance. The same parity check matrix H is shared between a decoder side and an encoder side. The parity check matrix H (or the information of the parity check matrix H) is read by the row processing unit 112, the column processing unit 113, the parity check unit 114, as needed.

FIG. 3 shows an example of the parity check matrix H, when M=8, N=12. The code length of coded data defined by the parity check matrix H with 8 rows and 12 columns is 12 bits, and the parity length of the coded data is 8 bits. The number of "1" included in the mth row of the parity check matrix H is called a row weight of the mth row (m is an integer, wherein 1≤m≤M). The number of "1" included in the nth column of the parity check matrix H is called a column weight of the nth column (n is an integer, wherein 1≤n≤N). In irregular LDPC codes, a row weight and a column weight of a parity check matrix H are non-uniform. The present embodiment is applicable to either regular LDPC codes or irregular LDPC codes.

Further, in the explanation hereafter, a set of column indices indicating column positions of "1" on the mth row will be referred to as A(m), a set of row indices indicating row positions of "1" in the nth column will be referred to as B(n). For example, in FIG. 3, A(2)={3, 5, 9}, B(3)={2, 7}. Since a total number of "1" included in a parity check matrix H is extremely small (in other words, the density of "1" is low) relative to the size of the matrix, the information of the parity check matrix H can be expressed with information on positions of "1" in the matrix, thereby saving the size of information in the check matrix H. In other words, the size of the circuit in the check matrix storage unit 115 can be reduced.

Figure 4:
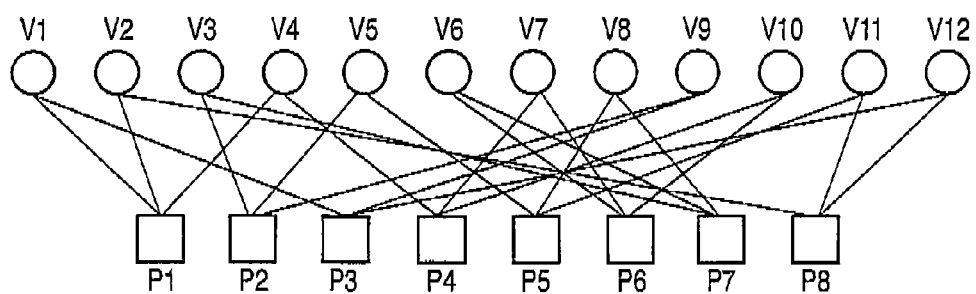
FIG. 4 is a graph of the LDPC check matrix of FIG. 3 using a Tanner graph.

As shown in FIG. 4, the parity check matrix H of FIG. 3 can be represented in another way using a Tanner graph. A Tanner graph consists of two types of node groups: a group of variable nodes (V1, . . . , V12 in FIG. 4) and a group of check nodes (P1, . . . P8 in FIG. 4). If the element in the mth row and the nth column is "1", an edge connects the check node Pm to the variable node Vn.

The row processing unit 112 generates an extrinsic value $\alpha_{mn}$ using input likelihood Fn obtained from the input likelihood storage unit 111, the information of the parity check matrix H from the parity check matrix storage unit 115 and a priori likelihood $\beta_{mn}$ from the column processing unit 113. More specifically, the row processing unit 112 generates extrinsic value $\alpha_{mn}$ by the following expression (2). The row processing unit 112 provides the column processing unit 113 and the parity check unit 114 with generated extrinsic value $\alpha_{mn}$.

$$\alpha_{mn} = \left( \prod_{n' \in A(m) \setminus n} \text{sign}(Fn' + \beta_{mn'}) \right) f\left( \sum_{n' \in A(m) \setminus n} f(|Fn' + \beta_{mn'}|) \right) \quad (2)$$

It should be noted that every a priori likelihood $\beta_{mn}$ at the first decoding is set to zero, and after the first decoding, a newest value which is fed back from the column processing unit 113 is set as a priori likelihood $\beta_{mn}$. The function sign(x) and the function f(x) in expression (2) are expressed in the following expressions (3 and 4). The row processing unit 112 may use a Min-Sum algorithm.

$$\text{sign}(x) = \begin{cases} 1 & (x \geq 0) \\ -1 & (x < 0) \end{cases} \quad (3)$$

$$f(x) = \ln \frac{\exp(x) + 1}{\exp(x) - 1} \quad (4)$$

The parity check unit 114 generates a temporary estimated word based on the parity check matrix H information from the check matrix storage unit 115, extrinsic value $\alpha_{mn}$ from the row processing unit 112 and input likelihood Fn from the input likelihood storage unit 111. More specifically, the parity check unit 114 generates the nth element of the temporary estimated word by the following expression (5).

$$\hat{c}_n = \begin{cases} 0, & \text{if } \text{sign}\left(Fn + \sum_{m' \in B(n)} \alpha_{m'n}\right) = 1 \\ 1, & \text{if } \text{sign}\left(Fn + \sum_{m' \in B(n)} \alpha_{m'n}\right) = -1 \end{cases} \quad (5)$$

Then, the parity check unit 114 checks whether the generated temporary estimated word is a code word defined by the check matrix H or not. More specifically, the parity check unit 114 calculates a parity check vector U by the following expression (6).

$$U = \hat{c} H^T \quad (6)$$

Each element in the parity check vector U indicates whether a corresponding check node satisfies the parity check or not (whether the parity of the corresponding check node is correct or not). If the mth element in the parity check vector U is "0," the mth check node Pm satisfies the parity check. If the mth element in the parity check vector U is "1," the mth check node Pm does not satisfy the parity check. The total number of "1" included in the parity check vector U is equal to the total number of check nodes that do not satisfy the parity check.

Figure 5:
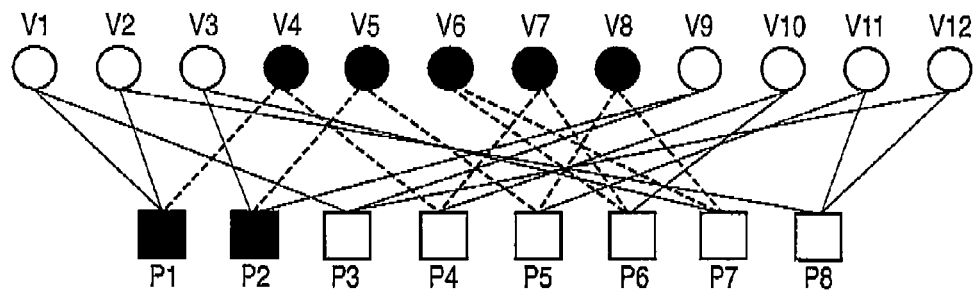
FIG. 5 is an explanatory drawing showing a result of a parity check.

For example, as shown in FIG. 5, when a bit error occurs in variable nodes V4, V5, V6, V7 and V8, a result of the parity check will be the parity check vector U=[11000000]. In FIG. 5, the black circles represent variable nodes V4, V5, V6, V7 and V8 in which bit errors occur; the broken lines represent the edges connecting those variable nodes V4, V5, V6, V7 and V8 to arbitrarily check nodes; and the black squares represent the check nodes that do not satisfy the parity check.

When the parity check vector U is a zero vector, it means all check nodes satisfy the parity check. If the parity check vector U becomes a zero vector, the parity check unit 104 outputs a temporary estimated word as a code word. If the parity check vector U is not a zero vector, as will be described later, updating extrinsic value $\alpha_{mn}$, the parity check based on updated extrinsic value $\alpha_{mn}$, and, in case where the parity check is not satisfied, updating a priori likelihood $\beta_{mn}$ are iterated, up to a maximum number of iterations Lmax 1. If the parity check vector U is not a zero vector and iterative times L1<Lmax 1, the parity check unit 114, for example, instructs the column processing unit 113 to carry out the column processing. The number of iterations L1 is counted (incremented) by, for example, the row processing unit 112.

The parity check unit 114 provides the post-processing determination unit 120 with information indicating the number of check nodes not satisfying the parity check, when the parity check vector U is not a zero vector and the number of iterations L1 reaches the maximum number of iterations Lmax1 (i.e., decoding failed). The parity check unit 114 provides the inversion node list generation unit 130 with information identifying check nodes not satisfying the parity check, information of the parity check matrix, and information indicating sings of a posteriori likelihood of each variable node, when the decoding fails (or when the post-processing determination unit 120 determines to carry out the post-processing.

The column processing unit 113 calculates a priori likelihood $\beta_{mn}$ using the information of the parity check matrix H from the parity check matrix storage unit 115 and extrinsic value $\alpha_{mn}$ from the row processing unit 112. More specifically, the column processing unit 113 calculates a priori likelihood $\beta_{mn}$ by the following expression (7). The column processing unit 113 feeds calculated a priori likelihood $\beta_{mn}$ back to the row processing unit 112.

$$\beta_{mn} = \sum_{m' \in B(n)\backslash m} \alpha_{m'n} \qquad (7)$$

The post-processing determination unit 120 inputs the information indicating the number of check nodes not satisfying the parity check from the LDPC decoding unit 110 (the parity check unit 114) to determine whether the number is greater than a threshold value K or not. If the number of check nodes not satisfying the parity check is greater than the threshold value K, the post-processing determination unit 120 determines to omit the post-processing, and if not greater, the unit determines to carry out the post-processing. When the post-processing is to be omitted, the post-processing determination unit 120 outputs information, for example, indicating a failure of the decoding to the outside of the decoder, then the decoding is completed; when the post-processing is to be carried out, the unit instructs, for example, the inversion node list generation unit 130 to generate an inversion node list.

Generally, when error floor occurs, the number of check nodes not satisfying the parity check tends to be relatively less. Thus, the post-processing determination unit 120 can determine whether error floor occurs or not simply using this tendency. As will be described later, errors in the error floor region can be effectively corrected by the post-processing carried out by the post-processing unit 140.

The inversion node list generation unit 130 inputs the information identifying check nodes not satisfying the parity check, the information of the parity check matrix, and the information indicating signs of the a posteriori likelihood of each variable node from the LDPC decoding unit 110 (the parity check unit 114). The inversion node list generation unit 130 generates an inversion node list which lists information identifying variable nodes connected to check nodes not satisfying the parity check (for example, indices for variable nodes) and information indicating signs of the a posteriori likelihood of each of the variable nodes. The inversion node list generation unit 130 provides the post-processing unit 140 with the generated inversion node list. Herein, an a posteriori likelihood Gj of a variable node Vj can be calculated using the following expression (8).

$$Gn = Fn + \sum_{m' \in B(n)} \alpha_{m'n} \qquad (8)$$

For example, as shown in FIG. 5, while a bit error occurs in variable nodes V4, V5, V6, V7 and V8 (actually, in temporary estimated words of the variable nodes, C4, C5, C6, C7 and C8), check nodes P1 and P2 do not satisfy the parity check. Thus, the inversion node list generation unit 130 generates an inversion node list of indices of variable nodes V1, V2, V3, V4, V5 and V9 which are connected to check nodes P1 and P2, and information indicating signs of the a posteriori likelihood of each of those variable nodes, sign (G1), sign (G2), sign (G3), sign (G4), sign (G5) and sign (G9).

The post-processing unit 140 inputs the inversion node list from the inversion node list generation unit 130. The post-processing unit 140 performs post processing described later, using the lists. When the decoding of coded data succeeds during the post-processing, the post-processing unit 140 outputs the result of the decoding (i.e., a code word) to the outside of the decoder, and the post-processing is completed. On the other hand, when the decoding fails (more specifically, no code word can be obtained after the post-processing), the post-processing unit 140 outputs information indicating failure of decoding to the outside of the decoder, and the post-processing completes.

Figure 6:
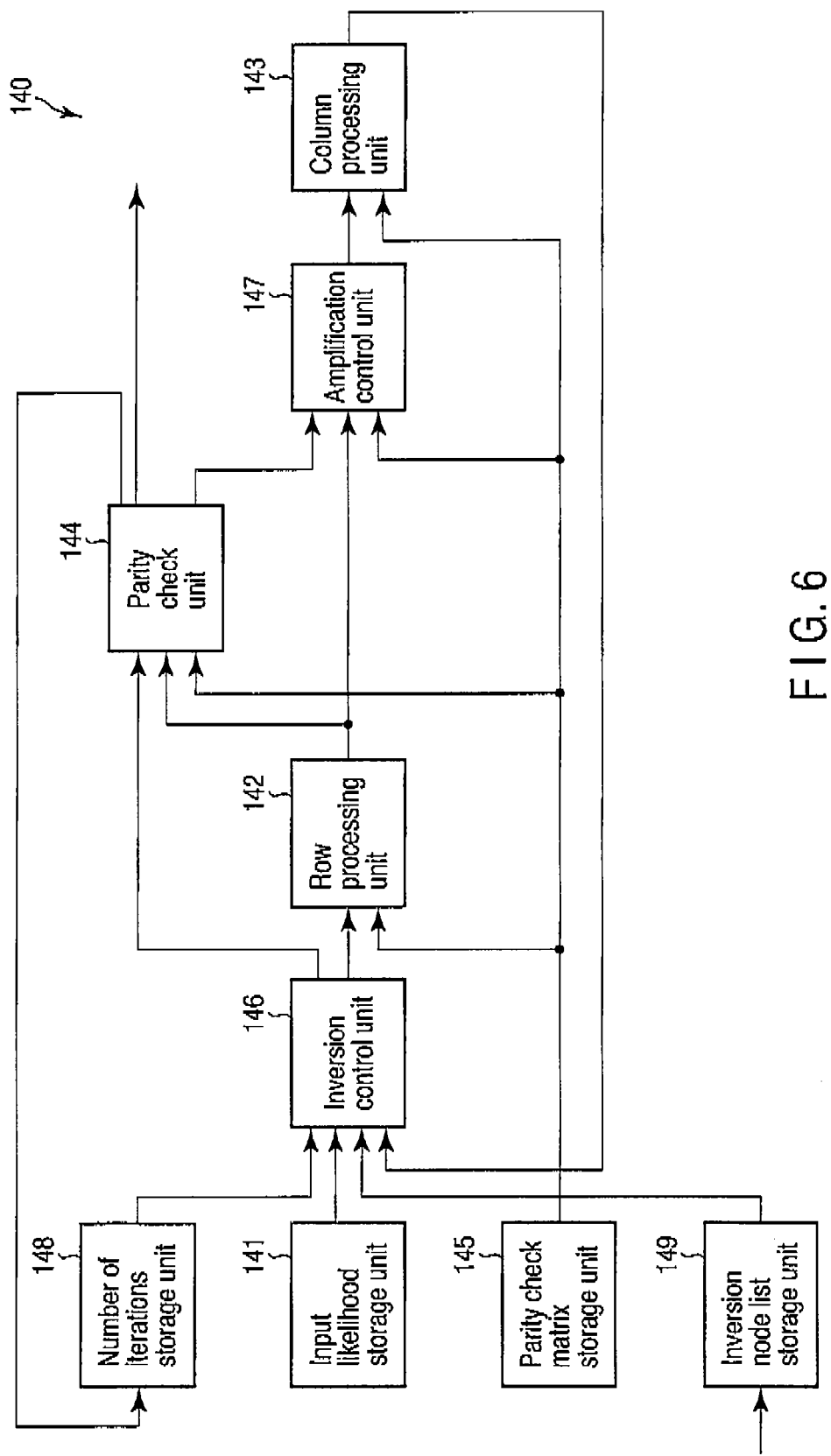
FIG. 6 is a block diagram showing an example of a post-processing unit shown in FIG. 1.

As shown in FIG. 6, the post-processing unit comprises an input likelihood storage unit 141, a row processing unit 142, a column processing unit 143, a parity check unit 144, a parity check matrix storage unit 145, an inversion control unit 146, an amplification control unit 147, a number of iterations storage unit 148, and an inversion node list storage unit 149.

The post-processing unit 140 and the LDPC decoding unit 110 may be separate functional unit, or may be an integrated functional unit. For example, the input likelihood storage unit 141, the row processing unit 142, the column processing unit 143, the parity check unit 144, and the check matrix storage unit 145 may respectively function as the input likelihood storage unit 111, the row processing unit 112, the column processing unit 113, the parity check unit 114, and the parity check matrix storage unit 115, while normal LDPC decoding which precedes the post-processing is being carried out. Also, although the structure of the LDPC decoding unit 110 is the same or similar as that of a typical LDPC decoder, the structure of each functional unit may be altered depending on implementation constraints. In other words, the present embodiment can be applied to an arbitrary message-passing type LDPC decoder.

The input likelihood storage unit 141 stores the same input likelihood Fn as the input likelihood storage unit 111 stores. The input likelihood storage unit 141 stores input likelihood Fn until the post-processing of coded data by the post-processing unit 140 completes. Input likelihood Fn is read by the row processing unit 142 as needed.

The parity check matrix storage unit 145 stores the same information of the parity check matrix H as the parity check matrix storage unit 115 stores. The information of the parity check matrix H is read by the row processing unit 142, the column processing unit 143, the parity check unit 144 and the amplification control unit 147, as needed.

The inversion control unit 146 reads input likelihood Fn from the input likelihood storage unit 141, reads the number of iterations L2 from the number of iterations storage unit 148, reads the inversion node list from the inversion node list storage unit 149, and inputs the a priori likelihood from the column processing unit 143. The inversion control unit 146 performs different processing in accordance with the number of iterations L2.

If the number of iterations L2 is an initial value (for example, "0"), the inversion control unit 146 resets all a priori likelihoods $\beta_{mn}$ to "0." Further, the inversion control unit 146 selects one variable node Vj for which inversion processing has not performed from among the nodes included in the inversion node list. The inversion control unit 146 inverts a sign, sign (Gj), of the a posteriori likelihood of the variable node Vj which is a target of inversion, and substitutes a value obtained by multiplying a configurable maximum absolute value Amax for an input likelihood Fj of the variable node Vj. In other words, the inversion control unit 146 calculates the following expression (9), and substitutes the input likelihood Fj for a positive maximum likelihood Amax or a negative maximum likelihood −Amax, in order to update the input likelihood Fj temporarily.

$$F_j = -\text{sign}(G_j) * A_{max} \quad (9)$$

Although a value of Amax may vary in accordance with a design of the post-processing unit 140 (for example, a bit resolution), the present embodiment is applicable to any arbitrary value. The inversion control unit 146 may carry out inversion processing different from expression (9). For example, the inversion control unit 146 may simply inverse a sign of an input likelihood, or may adjust the absolute value of the input likelihood to a value other than a maximum value after the inversion.

When the inversion control unit 146 has carried out inversion processing for a different variable node Vi just before carrying out inversion processing for the variable node Vj, the inversion control unit 146 resets an input likelihood Fi of the variable node Vi to an input likelihood Fi read from the input likelihood storage unit 141 (i.e., an initial value). The inversion control unit 146 gives the input likelihood Fn and a posteriori likelihood $\beta_{mn}$ to the row processing unit 142. The inversion control unit 146 gives input likelihood Fn to the parity check unit 144.

On the other hand, when the number of iterations L2 is a value other than the initial value, the inversion control unit 146 retains the input likelihood Fj (for example, Amax or −Amax) of a variable node for which inversion processing is carried out (in other words, a variable node which is currently a target for inversion). The inversion control unit 146 provides the row processing unit 142 with input likelihood Fn and a priori likelihood $\beta_{mn}$. The inversion control unit 146 provides the parity check unit 144 with input likelihood Fn.

The order of choosing variable nodes as a target for the inversion processing is arbitrary. The inversion control unit 146 may choose variable nodes in an ascending or descending order of variable node indices, or may choose variable nodes randomly. The inversion control unit 146 may choose variable nodes in an ascending order of absolute values of a posteriori likelihoods. Generally, a variable node with a small absolute value of an a posteriori likelihood is less reliable compared to a variable node with a large absolute value of an a posteriori likelihood (i.e., more likely to be an error). Choosing variable nodes as a target for the inversion processing in an increasing order of reliability would result in obtaining a code word in a short time. Further, regarding an irregular LDPC code, the inversion code control unit 146 may choose variable nodes in an ascending or descending order of row weights of variable nodes.

For example, if the inversion processing carried out for the variable node V4 in the example of FIG. 5, the error in the variable node V4 is corrected. It is expected that errors in the rest of the variable nodes, V5, . . . V8 are corrected by carrying out iterative decoding subsequently.

The row processing unit 142 generates an extrinsic value $\alpha_{mn}$ using input likelihood Fn and a posteriori likelihood $\beta_{mn}$ from the inversion control unit 146 and information of the check matrix H read from the check matrix storage unit 145. More specifically, the row processing unit 142 generates an extrinsic value $\alpha_{mn}$ by following expression (2) above. The row processing unit 142 provides the parity check unit 144 and the amplification control unit 147 with the generated extrinsic value $\alpha_{mn}$.

The parity check unit 144 reads the information of the check matrix H from the check matrix storage unit 146, inputs the extrinsic value $\alpha_{mn}$ from the row processing unit 142, and obtains the input likelihood Fn from the inversion control unit 146. The parity check unit 144 generates a temporary estimated word based on those values and information. More specifically, the parity check unit 144 generates the nth element of the temporary estimated word by following expression (5) above. The parity check unit 144 checks whether the generated temporary estimated word is the code word defined by the parity check matrix H. More specifically, the parity check unit 144 calculates the parity check vector U by following expression (6) above.

If the parity check vector U is a zero vector, the parity check unit 144 outputs the temporary estimated value as a code word to the outside of the decoder. On the other hand, if the parity check vector U is not a zero vector and the number of iterations L2 does not reach the maximum number of iterations Lmax2, the parity check unit 144 provides, for example, the amplification unit 147 with information identifying check nodes not satisfying the parity check. The number of iterations L2 is counted (incremented) by, for example, the row processing unit 142, and retained by the number of iterations storage unit 148. If the parity check vector U is not a zero vector and the number of iterations L2 reaches the maximum number of iterations Lmax2, the parity check unit 144 resets the number of iterations L2 stored by the number of iterations storage unit 148 to an initial value.

Further, the parity check unit 144 may determine whether an iteration discontinuation condition is satisfied or not. When the iteration discontinuation condition is satisfied, the parity check unit 144 resets the number of iterations L2 stored in the number of iterations storage unit 148 to an initial value. The iteration discontinuation condition will be described below.

Basically, the post-processing unit 140 inverts a chosen variable node, and then carries out iterative decoding. However, if an inappropriate variable node (i.e., a variable node with no error) is inverted, a code word cannot be obtained even after decoding is iterated. More specifically, as shown in FIG. 10, if an appropriate variable node (i.e., a variable node with an error) is inverted, although the number of check nodes not satisfying the parity check is temporarily increased, the number will be gradually decreased, and a code word can be obtained. On the other hand, if an inappropriate variable node is inverted, the number of check nodes not satisfying the parity check is increased and decreased in early stage (in FIG. 10, for example, when the number of iterations is close to 10) of the iterative decoding, similarly to a case in which an appropriate variable node is inverted. However, the number of check nodes not satisfying the parity check is first decreased and then increased; as a result, no code word can be obtained.

Consequently, it is possible to define an iteration discontinuation condition as "L2>Lin ("Lin" is less than Lmax2) and when the number of check nodes not satisfying the parity check is increased compared to that in a previous parity check." The above iteration discontinuation condition is of course merely an example of iteration discontinuation conditions, and it can be arbitrarily changed. By using such an iteration discontinuation condition, unnecessary iterative decoding can be canceled in midstream; as a result, a code word can be obtained in a short time.

The amplification control unit 147 inputs the extrinsic value $\alpha_{mn}$ from the row processing unit 142, inputs information identifying check nodes not satisfying the parity check from the parity check unit 144, and reads information of the parity check matrix H from the parity check matrix storage unit 145. The amplification control unit 147 carries out amplification processing to amplify the absolute value of extrinsic value $\alpha_{mn}$ of a check node not satisfying the parity check. For example, the amplification control unit 147 amplifies the absolute value of extrinsic value $\alpha_{mn}$ by following the expression (10) below. The amplification control unit 147 provides each amplified extrinsic value $\alpha_{mn}$ with the column processing unit 143.

$$\alpha_{mn} = W\alpha_{mn} \quad (10)$$

Herein, a constant W is greater than 1. More specifically, taking FIG. 5 as an example, if the variable node V4 is inverted, the check nodes P2 and P4 do not satisfy the parity check. Thus, the amplification control unit 147 amplifies the absolute value of each of extrinsic value $\alpha_{2n}$, $\alpha_{4n}$ of the check nodes P2, P4.

Further, the amplification control unit 147 may determine whether an amplification carrying out condition is satisfied or not. If the amplification carrying out condition is satisfied, the amplification control unit 147 carries out amplification processing for the absolute value of extrinsic value $\alpha_{mn}$ of a check node not satisfying the parity check. On the other hand, when the amplification carrying out condition is not satisfied, the amplification control unit 147 omits the amplification processing. For example, "the number of check nodes not satisfying the parity check is less than the first number of check nodes" can be defined as an amplification carrying out condition. When the number of check nodes not satisfying the parity check is greater than the first number of check nodes, increase of errors can be effectively avoided by not adjusting the extrinsic value $\alpha_{mn}$.

Also, the amplification control unit 147 may amplify the absolute value of extrinsic value $\alpha_{mn}$ by addition and subtraction of a constant, instead of expression (10). Or, it may amplify the absolute value of extrinsic value $\alpha_{mn}$ by a combination of addition, reduction, multiplication and division of a constant. Further, in addition to, or as an alternative of amplification of amplify the absolute value of extrinsic value $\alpha_{mn}$ of a check node not satisfying the parity check, the amplification control unit 147 may reduce the absolute value of some of or all extrinsic value $\alpha_{mn}$ of the check nodes satisfying the parity check. The amplification control unit 147 may reduce the absolute value by addition and subtraction of a constant, or a combination of addition, subtraction, multiplication and division. The constant used for amplifying (or reducing) extrinsic value $\alpha_{mn}$ may vary from one variable node to another variable node. For example, a constant may be dependent on a column weight of a variable node.

The column processing unit 143 reads information of the check matrix H from the check matrix storage unit 145, and inputs the extrinsic value $\alpha_{mn}$ from the amplification control unit 147. The column processing unit 143 calculates a priori likelihood $\beta_{mn}$ using these information and value. More specifically, the column processing unit 143 calculates a priori likelihood $\beta_{mn}$ by following expression (7) above. The column processing unit 143 feeds the calculated a priori likelihood $\beta_{mn}$ back to the inversion control unit 146.

The iteration numbers storage unit 148 inputs the number of iteration L2 from, for example, the parity check unit 144, and retains it. The number of iterations L2 is read by the inversion control unit 146, as needed. The inversion node list storage unit 149 inputs the inversion node list from the inversion node list generation unit 130, and retains it. The inversion node list is read by the inversion control unit 146 as needed.

Figure 7:
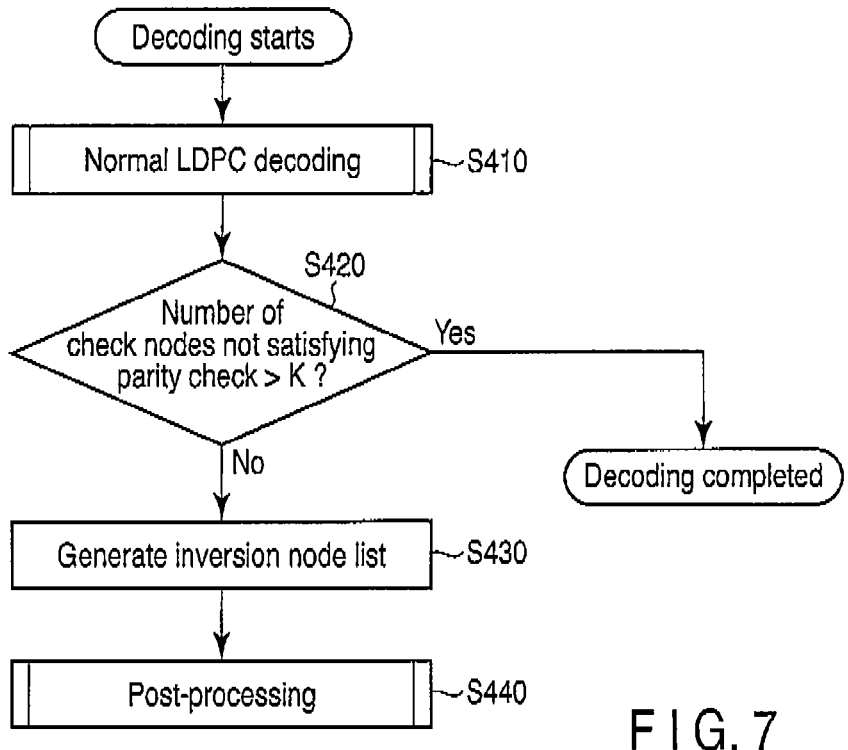
FIG. 7 is a flowchart showing an example of an operation of the error correction decoder shown in FIG. 1.

In the following, an example of the operation of the error correction decoder of FIG. 1 will be explained with reference to FIG. 7. The process shown in FIG. 7 begins upon input of likelihood Fn acquired by the signal processing unit in the previous stage to the input likelihood storage unit 110, and then the process proceeds to step S410. The process ends when a code word (a result of error correction decoding) is obtained (decoding succeeded) or when a code word cannot be obtained (decoding failed), and the LDPC decoding unit 110 inputs likelihood Fn related to coded data to be processed next is input (for example, a data frame).

In step S410, the LDPC decoding unit 110 carries out normal LDPC decoding. The detail of step S410 will be described later. In step S410, the process may end by successful decoding, or a code word cannot be obtained even when the number of iterations L1 reaches the maximum number of iterations Lmax1. When step S410 ends for a reason that, for example, the number of iterations L1 reaches the maximum number of iterations Lmax1, the process proceeds to step S420.

In step S420, the post-processing determination unit 120 determines whether the number of check nodes not satisfying the parity check is greater than a threshold value K or not. If the number of check nodes not satisfying the parity check is greater than the threshold value K, the process is ended (decoding failed), if not, the process proceeds to step S430.

In step S430, the inversion node list generation unit 130 generates an inversion node listing information identifying a variable node connecting to a check node not satisfying the parity check and information indicating sign of the a posteriori likelihood of the variable node. Following step S430, the post-processing unit 140 carries out post-processing (step S440). The details of step S440 will be described later. At the step S440, the process may end if the decoding succeeds, or may end without obtaining a code word even after carrying out the post-processing for all the variable nodes listed in the inversion node list (decoding failed).

Figure 8:
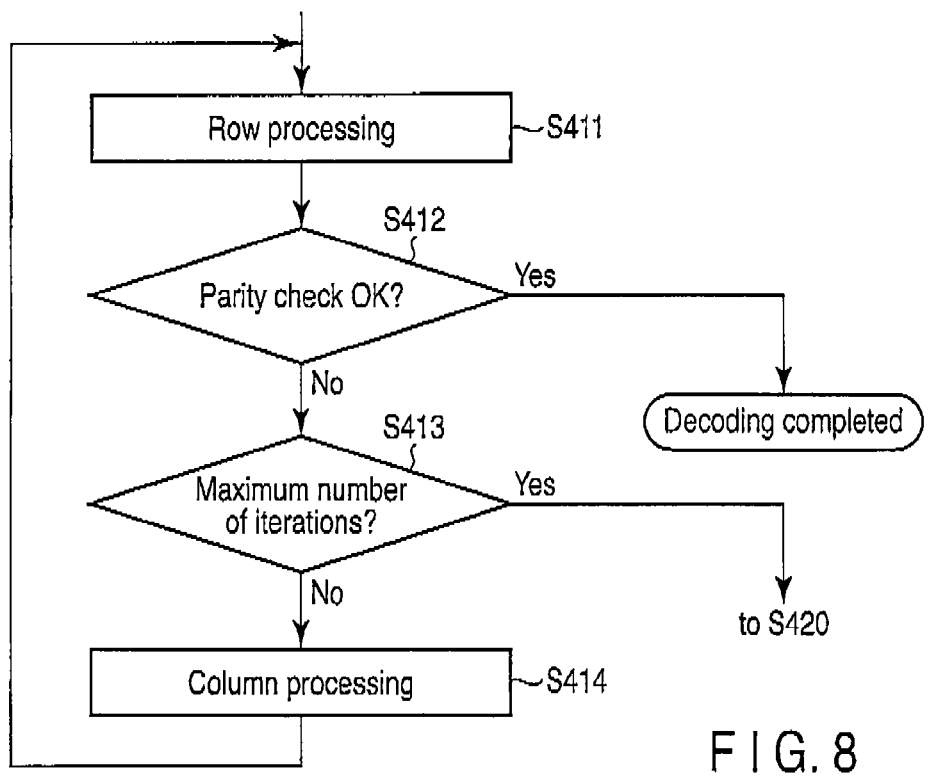
FIG. 8 is a flowchart showing an example of an operation of the LDPC decoding unit shown in FIG. 2.

In the following an example of the operation of the LDPC decoding unit 110 in FIG. 2 in step S410 above, with reference to FIG. 8.

Step S410 begins from step S411. In step S411, the row processing unit 112 generates extrinsic value $\alpha_{mn}$ using input likelihood Fn from the input likelihood storage unit 101, information of the check matrix H from the parity check matrix storage unit 115, and the (newest) a priori likelihood $\beta_{mn}$ from the column processing unit 113. The row processing unit 112 may count (increment) the number of iterations L1 every time the process in step S411 is carried out.

Next, the parity check unit 114 generates a temporary estimated word based on input likelihood Fn from the input likelihood storage unit 111, the information of the parity check matrix H from the parity check matrix storage unit 115, and extrinsic value $\alpha_{mn}$ from the row processing unit 112, and checks whether the generated temporary estimated word is a code word defined by the parity check matrix H (step S412). If the temporary estimated word is a code word, the process ends (decoding succeeded), if not, the process proceeds to step S413.

In step S413, the parity check unit 114 determines whether the number of iterations L1 reaches the maximum number of iterations Lmax1 or not. If L1 is equal to or greater than Lmax1, the process proceeds to step S420, and if L1<Lmax1, the process proceeds to step S414. When the process proceeds to step S420, the parity check unit 114 provides each of the post-processing determination unit 120 and the inversion node list generation unit 130 with necessary information.

In step S414, the column processing unit 113 calculates an a priori likelihood $\beta_{mn}$ using the information of the parity check matrix H from the parity check matrix storage unit 115 and extrinsic value $\alpha_{mn}$ from the row processing unit 112, and then, the process proceeds to step S411

Figure 9:
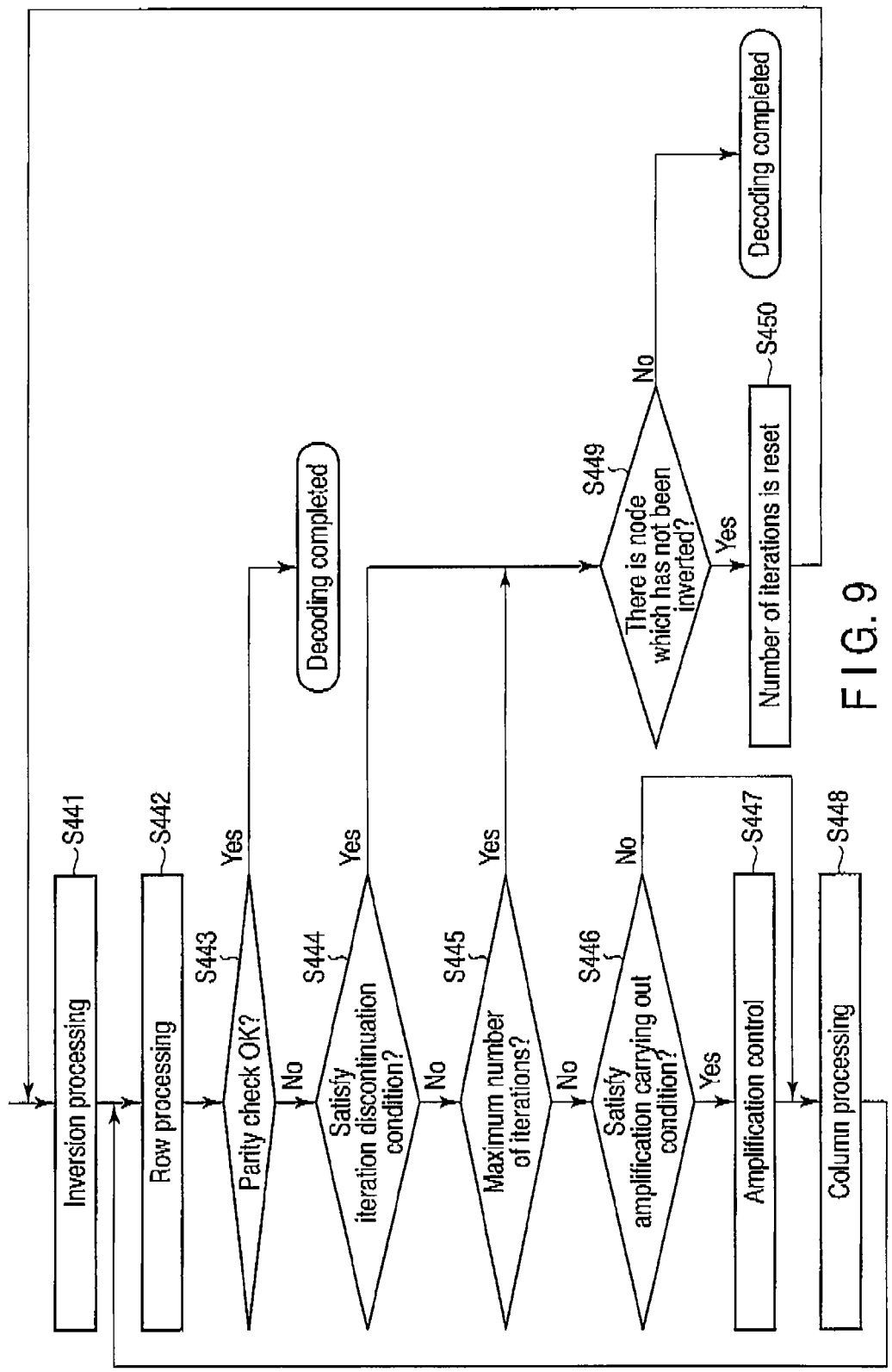
FIG. 9 is a flowchart showing an example of an operation of the post-processing unit shown in FIG. 6.

In the following, an example of the operation of the post-processing unit 140 illustrated in FIG. 6 in step S440 above, with reference to FIG. 9.

Step S440 begins upon step S441. In step S441, the inversion control unit 146 chooses a variable node Vj which has not been inverted from the inversion node list, and carries out inversion processing for the variable node. Further, the inversion control unit 146 resets all the a priori likelihood $\beta_{mn}$ to "0." Following step S441, the process proceeds to step S442.

In step S442, the row processing unit 142 generates an extrinsic value $\alpha_{mn}$ using input likelihood and a (newest) a priori likelihood $\beta_{mn}$ from the inversion control unit 146 and information of the check matrix H from the check matrix storage unit 145. The row processing unit 142 may count (increment) the number of iterative time L2 every time the process in step S442 is carried out.

Next, the parity check unit 144 generates a temporary estimated word based on input likelihood Fn from the inversion control unit 146, information of the parity check matrix H from the check matrix storage unit 145 and the extrinsic value $\alpha_{mn}$ from the row-processing unit 142, and checks whether the generated temporary estimated word is a code word defined by the parity check matrix H or not (step S443). If the generated temporary estimated word is a code word, the process ends (decoding succeeded), if not, the process proceeds to step S444.

In step S444, the parity check unit 144 determines whether the iteration discontinuation condition is satisfied or not. If iteration discontinuation condition is satisfied, the process proceeds to step S449, if not, the process proceeds to step S445. In step S445, the parity check unit 144 determines whether the number of iterations L2 reaches the maximum number of iterations Lmax2 or not. If L2 is equal to or greater than Lmax2, the process proceeds to step 9449, if L2<Lmax2, the process proceeds to step S446.

In step S446, the amplification control unit 147 determines whether the amplification carrying out condition is satisfied or not. If satisfied, the process proceeds to step S447, if not, the process proceeds to step S448. In step S447, the amplification control unit 147 amplifies the absolute value of the extrinsic value $\alpha_{mn}$ of the check node not satisfying the parity check, and then, the process proceeds to step S448.

In step S448, the column processing unit 143 calculates a priori likelihood $\beta_{mn}$ using the information of the parity check matrix H from the parity check matrix storage unit 145 and extrinsic value $\alpha_{mn}$ from the amplification control unit 147, and then, the process returns to step S442.

In step S449, the inversion control unit 146 determines whether there is a node which has not been inverted among the variable nodes listed in the inversion node list. If there is a node which has not been inverted in the list, the process proceeds to step S450, if not, the process ends (decoding failed). In step S450, the parity check unit 144 resets the number of iterations L2 to an initial value, and then, the process returns to step S441.

As explained above, the error correction decoder according to the first embodiment carries out the post-processing when a code word cannot be obtained even after sufficiently carrying out normal iterative decoding. In the post-processing, inversion of a variable node connected to a check node not satisfying the parity check and amplification of the absolute value of an extrinsic value of a check node not satisfying the parity check in the iterative decoding after the inversion of variable nodes are used in combination. Thus, according to the present error correction decoder, an error in an error floor region can be reduced and the ability of error correction can be effectively improved.

(Second Embodiment)

A storage apparatus according to the second embodiment is an application of the error correction decoder according to the above first embodiment. The storage apparatus is typically a memory card which includes a nonvolatile memory such as a flash memory and a memory controller to control the nonvolatile memory.

A storage apparatus 303 of FIG. 11 includes a semiconductor memory unit 305 which is a nonvolatile memory and a memory controller 302 which controls the semiconductor memory unit 305. The storage apparatus 303 removably connects to a host 304 (e.g., a personal computer, etc.) to transmit and receive data with the host 304. For example, the host 304 can read data from and write data on the storage apparatus 303.

The memory controller 302 includes a read-only memory (ROM) 307, a central processing unit (CPU) core 308, a random access memory (RAM) 309, a host interface (I/F) 310, an error correction unit 311 and a memory interface 312. Each element of the memory controller 302 is connected to each other via a bus 306.

The CPU core 308 transmits and receives data with the host 304 through the host interface 310 and with the semiconductor memory unit 305 through the memory interface 312. In other words, the CPU core 308 can function as a reading unit to receive data from the semiconductor memory unit 305 or as a writing unit to transmit data on the semiconductor memory unit 305. Firmware (FW) executed by the CPU core 308 realizes address management of the semiconductor unit 306 including restrictions on the number of rewritable times. Further, the FW realizes the control of whole storage apparatus 303 in accordance with commands input from the host 304.

The ROM 307 stores a control program for the storage apparatus 303, etc. The RAM 309 stores an address conversion table which is necessary for address management, information on abnormal circuits, and so on.

The error correction unit 311 includes a decoder 301 and an encoder 313. The error correction decoder according to the first embodiment is incorporated into to the decoder 301. The decoder 301 performs error correction decoding on data read from the semiconductor memory unit 305. On the other hand, the encoder 313 adds an error correction code to data to be written on the semiconductor memory 305.

As explained in the above, in the storage apparatus according to the second embodiment, the error correction decoder according to the aforementioned first embodiment is incorporated into the memory controller. Thus, according to the present storage apparatus, an excellent ability of error correction on the read data can be achieved.

(Third Embodiment)

A receiver according to the third embodiment is an application of the error correction decoder according to the aforementioned first embodiment. The receiver according to the present embodiment includes, as shown in FIG. 12, an antenna 320, a frequency converter 321, an analog-to-digital (A/D) converter 322, a demodulator 323 and a decoder 324. The receiver of FIG. 12 receives encoded and modulated signals and reconstructs received data by demodulating and decoding. Typically, the receiver of FIG. 9 may be a wireless receiver (which supports, for example, cellular communication and a wireless local area network [LAN]) or a broadcast receiver. The receiver may also include a low-noise amplifier or a filter (not shown in FIG. 12).

The antenna 320 receives high-frequency radio signals. The frequency converter 321 downconverts the received signals from the antenna 320 to intermediate-frequency signals. The A/D converter 322 digitizes the intermediate frequency signals from the frequency converter 321. The demodulator 323 demodulates the digital signals from the A/D converter 322 in accordance with a demodulation scheme corresponding to a modulation scheme on the transmitter side.

The error correction decoder according to the aforementioned first embodiment is incorporated into the decoder 324. The decoder 324 performs decoding process including error correction decoding on the demodulated data from the demodulator 323 to reconstruct the received data.

As explained above, in the receiver according to the third embodiment, the error correction decoder according to the aforementioned first embodiment is incorporated into the decoder. Thus, according to the present receiver, an excellent ability of error correction for the received data can be achieved. The transmitter-receiver may be configured by combining the elements shown in FIG. 12 and other necessary elements for a transmitter that are not shown in FIG. 12.

The processing of each of the above-described embodiments can be realized using a general-purpose computer as a basic hard ware. It is possible to provide a program that realizes the processing of each of the above-described embodiments by storing the program in a computer-readable storage medium. Such a program is stored in a storage medium in a file of installable form, or a file of executable form. A storage medium may be a magnetic disk, an optical disc (such as CD-ROM, CD-R, DVD, etc.), a magneto-optical disc (MO, etc.) or a semiconductor memory, as long as it can store a program and is computer-readable. Also, the program that realizes the processing of each of the above-described embodiments may be stored on a computer (server) connected to network such as the Internet and may be downloaded by a computer (client) via network.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An error correction decoder carrying out iterative decoding for coded data based on LDPC code, comprising:
   a generation unit configured to generate an inversion node list listing variable nodes connected to check nodes not satisfying a parity check when a code word cannot be obtained after carrying out the iterative decoding a first number of iterations;
   an inversion control unit configured to choose a variable node which is a target for inversion from among the variable nodes listed in the inversion node list, and to carry out inversion processing which includes updating an input likelihood of the variable node which is the target for inversion temporarily by inverting a sign of an a posteriori likelihood of the variable node which is the target for inversion;
   a row processing unit configured to generate each extrinsic value based on each input likelihood and each a priori likelihood iteratively after carrying out the inversion processing;
   a parity check unit configured to generate a temporary estimated word based on the each input likelihood and the each extrinsic value, to carry out the parity check for the temporary estimated word, and to determine the temporary estimated word as the code word when all check nodes satisfy the parity check;
   an amplification control unit configured to carry out amplification processing to amplify an absolute value of the extrinsic value from a check node not satisfying the parity check to a variable node when at least one check node does not satisfy the parity check for the temporary estimated word;
   a column processing unit configured to update the each a priori likelihood based on the each extrinsic value after the amplification processing.

2. The decoder according to claim 1, wherein the inversion control unit resets the input likelihood of the variable node which is the target for inversion to an initial value, when the parity check is iterated a second number of times after the inversion processing is carried out for the variable node which is the target for inversion and when a number of check nodes not satisfying the parity check increases when compared to a previous parity check, and the inversion control unit chooses a variable node which has not been inverted from among the variable nodes listed in the inversion node list to carry out the inversion processing.

3. The decoder according to claim 1, wherein the inversion control unit chooses the variable node which is the target for inversion in an ascending order of absolute values of the a posteriori likelihoods.

4. The decoder according to claim 1, wherein the amplification control unit carries out the amplification processing if a number of check nodes not satisfying the parity check is less than a first number, and if not, the unit omits the amplification processing.

5. The decoder according to claim 1, wherein the inversion control unit carries out the inversion processing which includes updating the input likelihood of the variable node which is the target for inversion temporarily by inverting the sign of the posteriori likelihood of the variable node which is the target for inversion, and substituting a value obtained by multiplying the inverted sign by a configurable maximum absolute value to the likelihood of the variable node which is the target for inversion.

6. The decoder according to claim 1, wherein the inversion control unit chooses the variable node which is the target for inversion in an ascending order of column weights.

7. A storage apparatus, comprising:
   a semiconductor memory unit configured to store the coded data; and
   a controller including:
      a reading unit configured to receive the coded data from the semiconductor memory unit; and
      the decoder according to claim 1.

* * * * *